(12) United States Patent
Suwa

(10) Patent No.: US 8,004,067 B2
(45) Date of Patent: Aug. 23, 2011

(54) SEMICONDUCTOR APPARATUS

(75) Inventor: Yoshito Suwa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 546 days.

(21) Appl. No.: 12/025,299

(22) Filed: Feb. 4, 2008

(65) Prior Publication Data

US 2008/0315197 A1    Dec. 25, 2008

(30) Foreign Application Priority Data

Mar. 6, 2007  (JP) ................. 2007-055967

(51) Int. Cl.
    *H01L 23/552*   (2006.01)
(52) U.S. Cl. ........ 257/659; 257/660; 257/536; 257/173; 257/355; 257/360; 257/E23.114; 257/E23.002
(58) Field of Classification Search .......... 257/659, 257/660, 536, 173, 355, 360, E23.114, E23.002
    See application file for complete search history.

(56) References Cited

U.S. PATENT DOCUMENTS

| 5,139,959 A | 8/1992 | Craft et al. |
| 5,204,988 A | 4/1993 | Sakurai |
| 5,589,415 A | 12/1996 | Blanchard |
| 5,670,819 A | 9/1997 | Yamaguchi |
| 2004/0245574 A1 | 12/2004 | Ker et al. |

FOREIGN PATENT DOCUMENTS

JP    2000-299457    10/2000

*Primary Examiner* — David A Zarneke

(74) *Attorney, Agent, or Firm* — Turocy & Watson, LLP

(57) ABSTRACT

A semiconductor apparatus includes: a substrate of single crystal silicon; a first device formed in a first region of a surface of the substrate; a first interlayer insulating film formed on the substrate; a polycrystalline silicon layer formed in a second region on the first interlayer insulating film; a second device formed in the polycrystalline silicon layer; a second interlayer insulating film formed on the first interlayer insulating film, the second interlayer insulating film covering the polycrystalline silicon layer; and a pad formed in a third region on the second interlayer insulating film. The second region includes at least part of a directly overlying zone of the first region. The third region includes at least part of a region which is the directly overlying zone of the first region and a directly overlying zone of the second region.

4 Claims, 9 Drawing Sheets

CHIP SIZE
ABOUT 30% REDUCED

CHIP SIZE ABOUT 50% REDUCED

US 8,004,067 B2

SEMICONDUCTOR APPARATUS

CROSS-REFERENCE TO RELATED APPLICATIONS

This application is based upon and claims the benefit of priority from the prior Japanese Patent Application No. 2007-055967, filed on Mar. 6, 2007; the entire contents of which are incorporated herein by reference.

BACKGROUND OF THE INVENTION

1. Field of the Invention

This invention relates to a semiconductor apparatus, and more particularly to a semiconductor apparatus including a single crystal silicon substrate.

2. Background Art

Conventionally, a semiconductor apparatus includes not only a functional device for serving a function essential to the semiconductor apparatus, but also an electrostatic voltage withstanding protective device for protecting the functional device from static electricity (see, e.g., JP-A 2000-299457 (Kokai)). However, the existence of the electrostatic voltage withstanding protective device hampers downsizing of the semiconductor apparatus.

SUMMARY OF THE INVENTION

According to an aspect of the invention, there is provided a semiconductor apparatus including: a substrate of single crystal silicon; a first device formed in a first region of a surface of the substrate; a first interlayer insulating film formed on the substrate; a polycrystalline silicon layer formed in a second region on the first interlayer insulating film; a second device formed in the polycrystalline silicon layer; a second interlayer insulating film formed on the first interlayer insulating film, the second interlayer insulating film covering the polycrystalline silicon layer; and a pad formed in a third region on the second interlayer insulating film, the second region including at least part of a directly overlying zone of the first region, and the third region including at least part of a region which is the directly overlying zone of the first region and a directly overlying zone of the second region.

According to another aspect of the invention, there is provided a semiconductor apparatus including: a substrate of single crystal silicon; a first device formed in a first region of a surface of the substrate; an interlayer insulating film formed on the substrate; a polycrystalline silicon layer formed in a second region on the interlayer insulating film; and a second device formed in the polycrystalline silicon layer, the second region including at least part of a directly overlying zone of the first region.

According to another aspect of the invention, there is provided a semiconductor apparatus including: a substrate of semiconductor material; a first device formed in a first region of a surface of the substrate; an interlayer insulating film formed on the substrate; a semiconductor layer formed in a second region on the interlayer insulating film; and a second device formed in the semiconductor layer, the second region including at least part of a directly overlying zone of the first region.

BRIEF DESCRIPTION OF THE DRAWINGS

FIG. 3A shows the semiconductor apparatus according to the comparative example, FIG. 3B shows the semiconductor apparatus according to this embodiment.

FIG. 4A shows the semiconductor apparatus according to the comparative example, FIG. 3B shows the semiconductor apparatus according to this embodiment.

DETAILED DESCRIPTION OF THE INVENTION

An embodiment of the invention will now be described with reference to the drawings.

Figure 1:
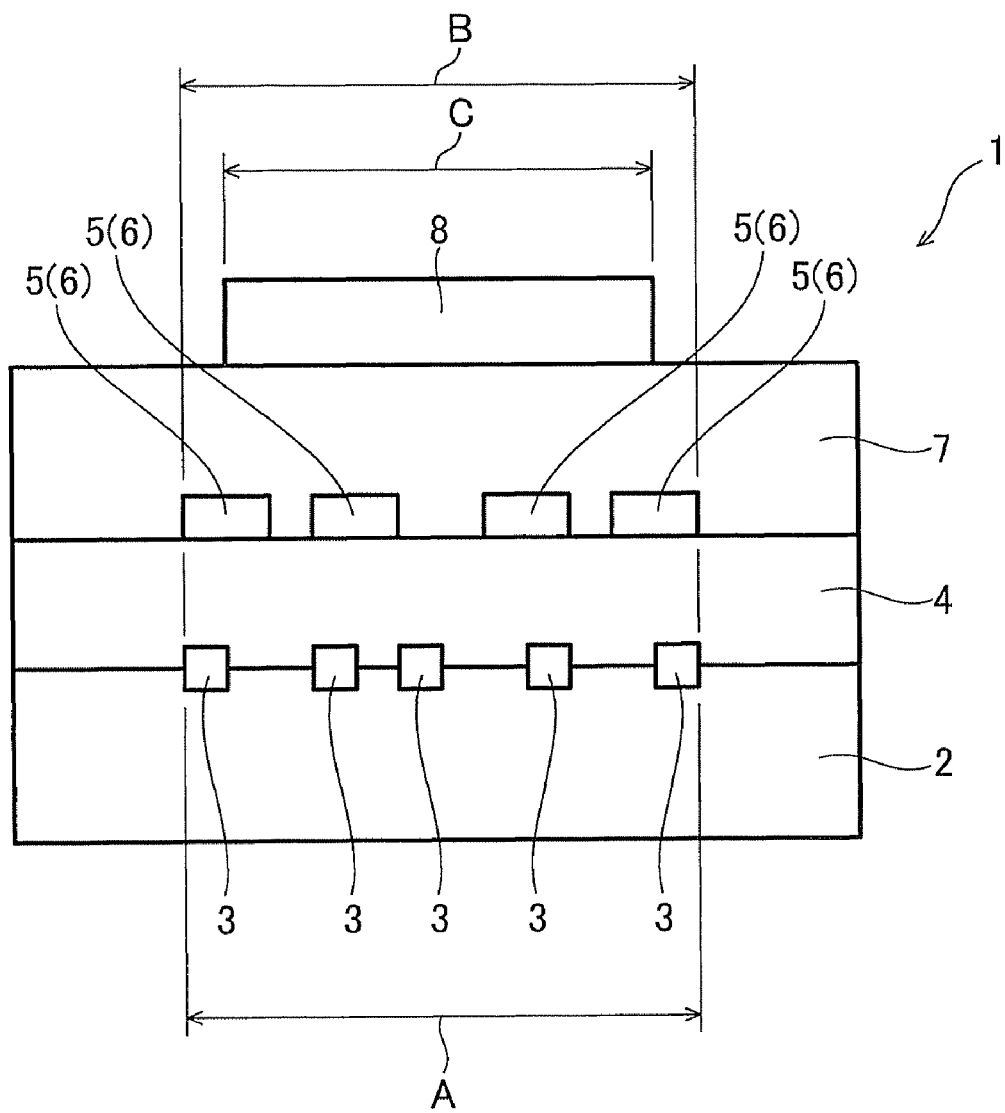
FIG. 1 is a cross-sectional view schematically illustrating a semiconductor apparatus according to an embodiment of the invention.

FIG. 1 is a cross-sectional view schematically illustrating a semiconductor apparatus according to this embodiment.

As shown in FIG. 1, the semiconductor apparatus 1 according to this embodiment includes a substrate 2 of single crystal silicon, and a plurality of devices 3 are formed in a device region A of the surface of the substrate 2. The device 3 is illustratively a device serving a function essential to the semiconductor apparatus 1 and constituting a semiconductor circuit. The device 3 is illustratively an active device such as a transistor or diode, or a passive device such as a resistor or capacitor. An interlayer insulating film 4 is formed on the substrate 2 so as to cover the devices 3. In this description, the surface side of the substrate 2 where the devices 3 are formed is referred to by "on" or "above", and the direction away from the substrate 2 perpendicular to this surface is referred to by "directly above" or "directly overlying".

A plurality of polycrystalline silicon layers 5 are formed in a protective region B on the interlayer insulating film 4. The protective region B is a region including at least part of the directly overlying zone of the device region A. That is, as viewed perpendicularly to the surface of the substrate 2 (hereinafter referred to as "in plan view"), at least part of the device region A and at least part of the protective region B overlap each other. For example, the polycrystalline silicon layer 5 is deposited by plasma CVD (chemical vapor deposition), its upper surface is planarized by CMP (chemical mechanical polishing), and it is patterned by photolithography. One device 6 is illustratively formed in each polycrystalline silicon layer 5. The device 6 is illustratively a protective device for protecting the device 3. Specifically, the device 6 is an electrostatic voltage withstanding protective device for protecting the device 3 from surge voltage due to static electricity, and illustratively a diode, transistor, or thyristor. Furthermore, an interlayer insulating film 7 is provided on the interlayer insulating film 4 so as to cover the polycrystalline silicon layers 5.

A pad 8 is provided in a pad region C on the interlayer insulating film 7. The pad region C includes at least part of the region that is the directly overlying zone of the device region A and the directly overlying zone of the protective region B. That is, in plan view, the device region A, the protective region B, and the pad region C overlap at least partially each other. A gold wire, for example, is supersonic-bonded to the pad 8, or a bump such as a gold bump or a copper bump is formed on the pad 8. The pad 8 thereby serves to connect the internal circuit of the semiconductor apparatus 1 composed of the device 3 and the protective circuit composed of the device 6 to the outside of the semiconductor apparatus 1.

Next, the operation and effect of this embodiment are described.

In this embodiment, a protective region B is provided in a region (hereinafter referred to as "directly overlying zone neighborhood") including at least part of the directly overlying zone of the device region A, a polycrystalline silicon layer 5 is formed in the protective region B, and a device 6 is formed in the polycrystalline silicon layer 5. Hence the semiconductor apparatus 1 does not need a dedicated space for placing the device 6 and can be downsized. Thus it is possible to realize a semiconductor package such as a BGA (ball grid array) package, a CSP (chip size package), and a flip-chip package having small die size and high density.

The device 6 is spaced from the substrate 2 via the interlayer insulating film 4. Hence parasite capacitance is not substantially produced between the device 6 and the substrate 2. Consequently, power consumption due to parasite capacitance can be prevented. On the contrary, in conventional semiconductor apparatuses where the device 6 is formed in the surface of the substrate 2 by ion implantation or other methods, the portion of the substrate 2 with the device 6 formed therein is opposed to the remaining portion across a depletion layer. Hence a parasite capacitance is produced.

The device 6 formed in the polycrystalline silicon layer 5 may be less controllable than the device 3 formed in the surface of the single crystal silicon substrate 2. However, the device 6 serving as an electrostatic voltage withstanding protective device does not need so high controllability, and hence no problem arises practically. It is noted that the device 6 can be formed as a normal functional device if its controllability can be sufficiently increased. For example, it can be formed as an active device such as an NPN-type transistor and a PNP-type transistor or a passive device such as a resistor.

On the other hand, the device 3 can enjoy superior characteristics because it is formed in the surface of the substrate 2 made of single crystal silicon. Furthermore, conventional techniques can be directly used for the processes of designing and manufacturing the device 3. The device 6 can be easily fabricated because it can be formed by conventional methods including depositing a polycrystalline silicon layer, planarizing its upper surface, patterning it, and implanting ions therein. Furthermore, formation of the device 6 does not affect the processes of designing and manufacturing the device 3. Hence conventional techniques can be directly used for the device 3.

In general, a semiconductor apparatus includes a pad for connecting the inside of the semiconductor apparatus to its outside. The pad needs a certain amount of area under packaging constraints. Hence, in a conventional semiconductor apparatus, the area of the pad may account for a large share of the overall area of the semiconductor apparatus, which, along with the existence of the electrostatic voltage withstanding protective device, hampers downsizing of the semiconductor apparatus. That is, there are products where the final chip size is governed not by the device region serving the function essential to the semiconductor apparatus, but by nonessential factors such as the electrostatic voltage withstanding protective device and the pad.

In contrast, the semiconductor apparatus 1 according to this embodiment includes a pad region C in the directly overlying zone neighborhood of the device region A and the protective region B. Hence there is no need of a dedicated space for providing the pad 8. Thus downsizing of the semiconductor apparatus 1 is not hampered by the pad region C, and the semiconductor apparatus 1 can be further downsized. Furthermore, a sufficient number of pads having sufficient area can be formed without concern about increasing the size of the overall semiconductor apparatus. Thus packaging constraints can be significantly alleviated.

Furthermore, a polycrystalline silicon layer 5 and an interlayer insulating film 7 are interposed between the pad 8 and the device 3. Hence the polycrystalline silicon layer 5 and the interlayer insulating film 7 serve as a buffer when a gold wire, for example, is supersonic-bonded to the pad 8 or a bump such as a gold bump or a copper bump is formed on the pad 8. Thus mechanical stress during bonding a gold wire or a bump to the pad 8 can be prevented from being transferred to the device 3. Consequently, bonding damage to the semiconductor apparatus 1 can be alleviated.

In the following, the effect of this embodiment is described quantitatively in comparison with a comparative example.

Figure 2:
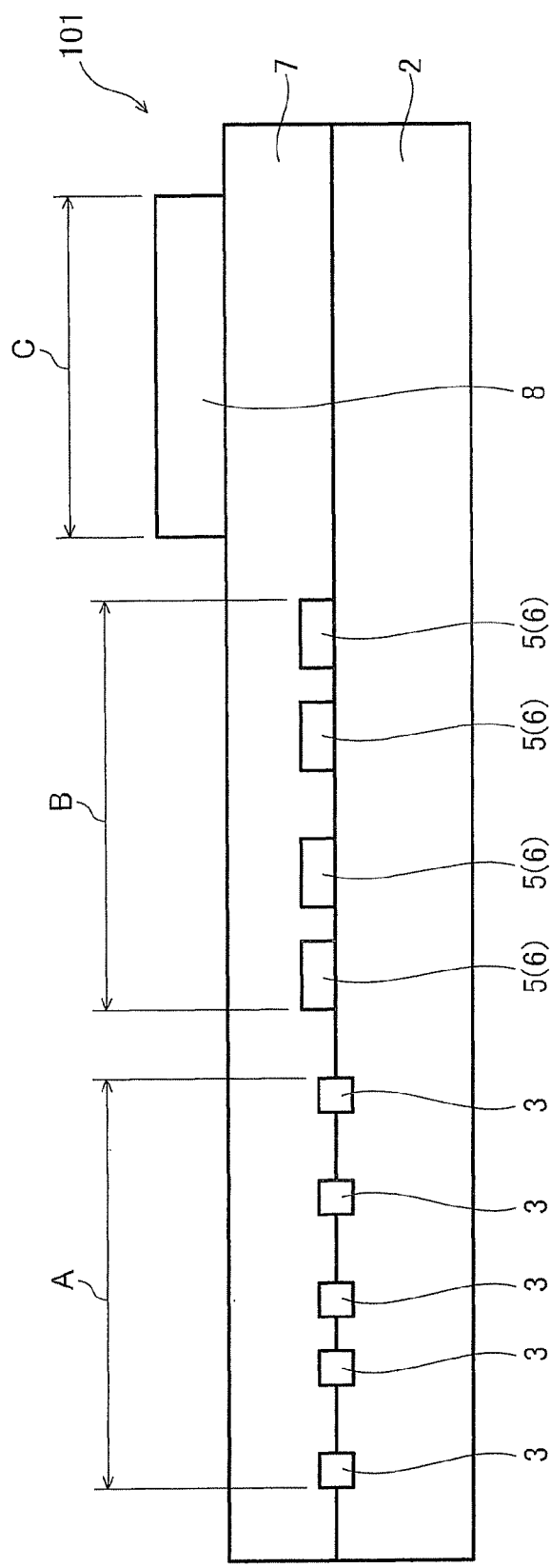
FIG. 2 is a cross-sectional view schematically showing a semiconductor apparatus according to a comparative example.

FIG. 2 is a cross-sectional view schematically showing a semiconductor apparatus according to the comparative example.

Figure 3A:
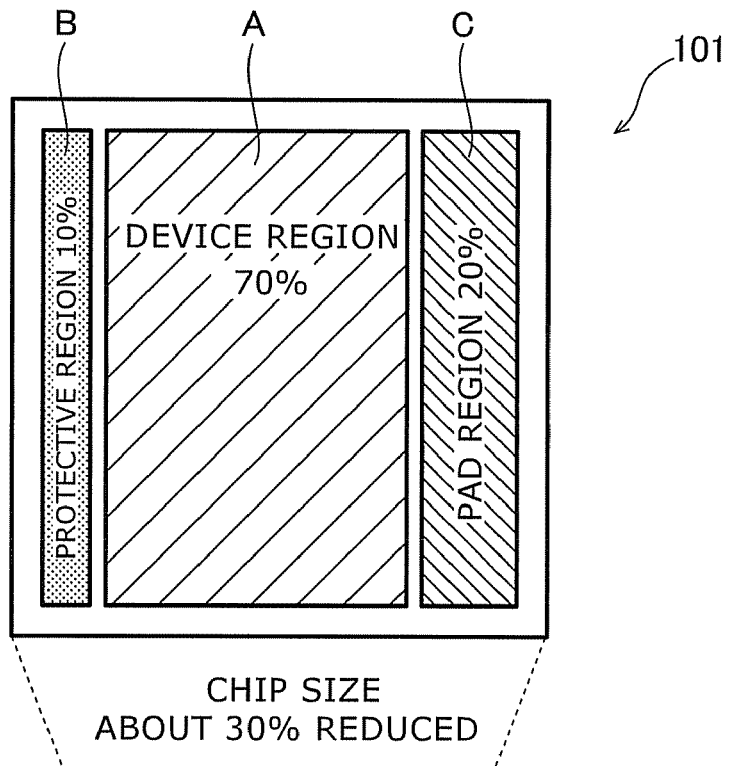
FIGS. 3A, 3B are plan views schematically showing the effect of this embodiment, where
Figure 3B:
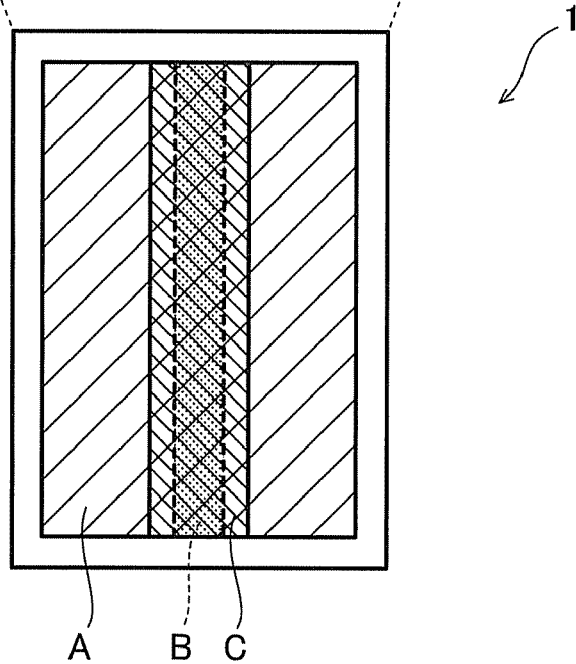
Figure 4A:
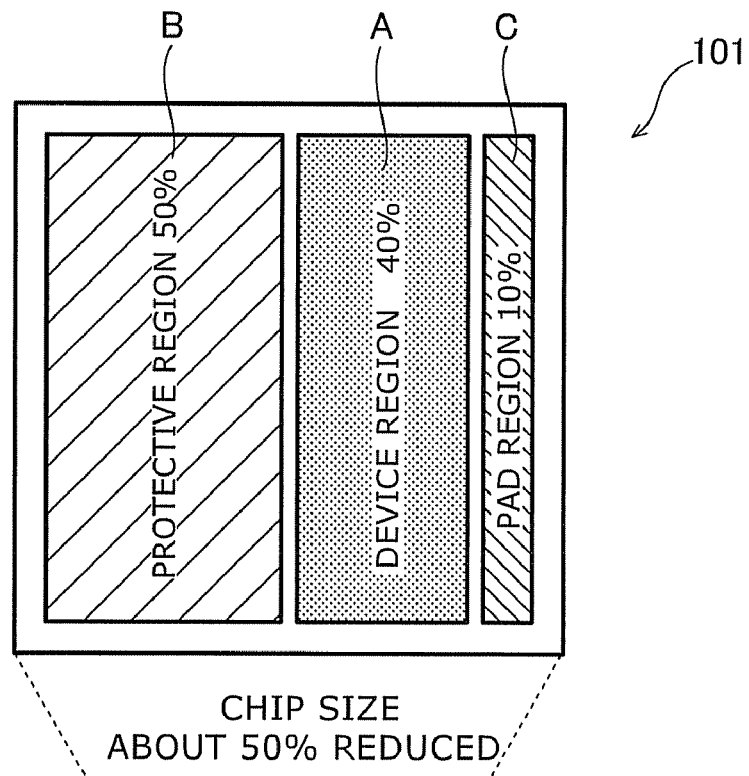
FIGS. 4A, 4B are plan views schematically showing the effect of this embodiment, where
Figure 4B:
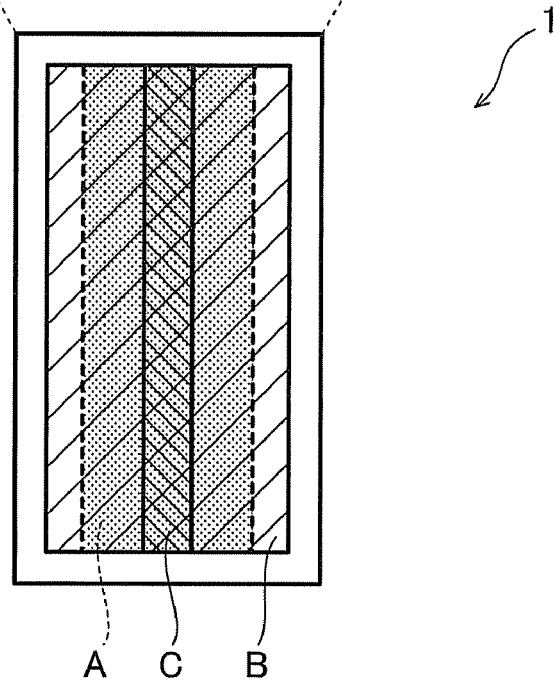

FIGS. 3A, 3B, 4A, and 4B are plan views schematically showing the effect of this embodiment, where FIGS. 3A and 4A show the semiconductor apparatus according to the comparative example, FIGS. 3B and 4B show the semiconductor apparatus according to this embodiment.

As shown in FIG. 2, in the semiconductor apparatus 101 according to the comparative example, a device region A and a protective region B are separately defined in the surface of a single crystal silicon substrate 2. Functional devices 3 are formed in the device region A, and protective devices 6 are formed in the protective region B. That is, the functional devices 3 and the protective devices 6 are coplanarly formed. An interlayer insulating film 7 is provided on the substrate 2 so as to cover the functional devices 3 and the protective devices 6. A pad 8 is provided in a pad region C on the interlayer insulating film 7. The pad region C is located outside the directly overlying zone of the device region A and the directly overlying zone of the protective region B. That is, in plan view, the device region A, the protective region B, and the pad region C do not overlap each other.

In the following, a description is given with reference to a numerical example.

Consider a case where the protective device is a diode in the semiconductor apparatus 101 according to the comparative example. As shown in FIG. 3A, for example, in plan view, the device region A with the functional devices 3 formed therein accounts for 70% in area of the overall semiconductor apparatus 101, the protective region B with the protective devices 6 (diodes) formed therein accounts for 10% in area, and the pad region C with the pad 8 formed therein accounts for 20% in area.

In this case, according to this embodiment, as shown in FIG. 3B, the semiconductor apparatus can be configured as a multilevel structure as described above. Thus the protective region B accounting for 10% of the overall area can be placed in the directly overlying zone of the device region A accounting for 70% in area. Furthermore, the pad region C accounting for 20% of the overall area can also be placed in a region that is in the directly overlying zone of the device region A and includes the directly overlying zone of the protective region B. Thus, in plan view, the area required for the semiconductor apparatus 1 is only the area of the device region A. Hence 70% of the area of the semiconductor apparatus 101 according to the comparative example is sufficient for the area of the semiconductor apparatus 1 according to this embodiment, and the semiconductor apparatus can be downsized.

Furthermore, consider a case where the protective device 6 of the semiconductor apparatus 101 according to the comparative example is a thyristor. As shown in FIG. 4A, for example, in plan view, the device region A with the functional devices 3 formed therein accounts for 40% in area of the overall semiconductor apparatus 101, the protective region B with the protective devices 6 (thyristors) formed therein accounts for 50% in area, and the pad region C with the pad 8 formed therein accounts for 10% in area.

In this case, according to this embodiment, as shown in FIG. 4B, the protective region B accounting for 50% of the overall area can be placed in a region including the directly overlying zone of the device region A accounting for 40% in area, and the pad region C accounting for 10% of the overall area can be placed in the directly overlying zone of the device region A and the protective region B. Consequently, in plan view, the area required for the semiconductor apparatus 1 is only the area of the protective region B. Hence 50% of the area of the semiconductor apparatus 101 according to the comparative example is sufficient for the area of the semiconductor apparatus 1 according to this embodiment. Thus, in this example, the semiconductor apparatus can be further downsized.

In this embodiment, the devices 3 and 6 are provided separately in two levels, that is, in the surface of the substrate 2 and in the polycrystalline silicon layer 5. However, the invention is not limited thereto, but the devices may be provided separately in three or more levels.

In the following, examples for realizing this embodiment are described.

To begin with, a first example is described.

Figure 5:
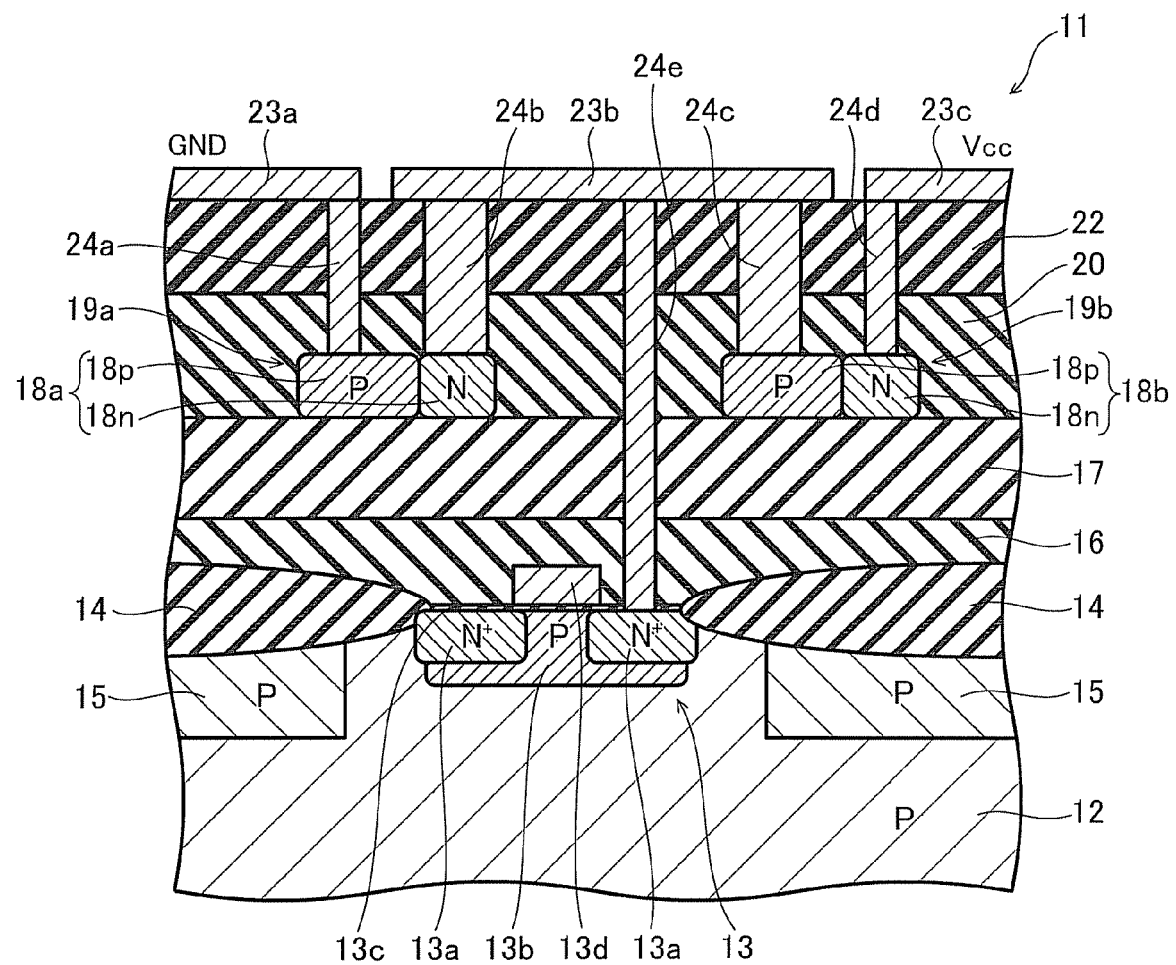
FIG. 5 is a cross-sectional view illustrating a semiconductor apparatus according to a first example of the invention.

FIG. 5 is a cross-sectional view illustrating a semiconductor apparatus according to this example.

Figure 6:
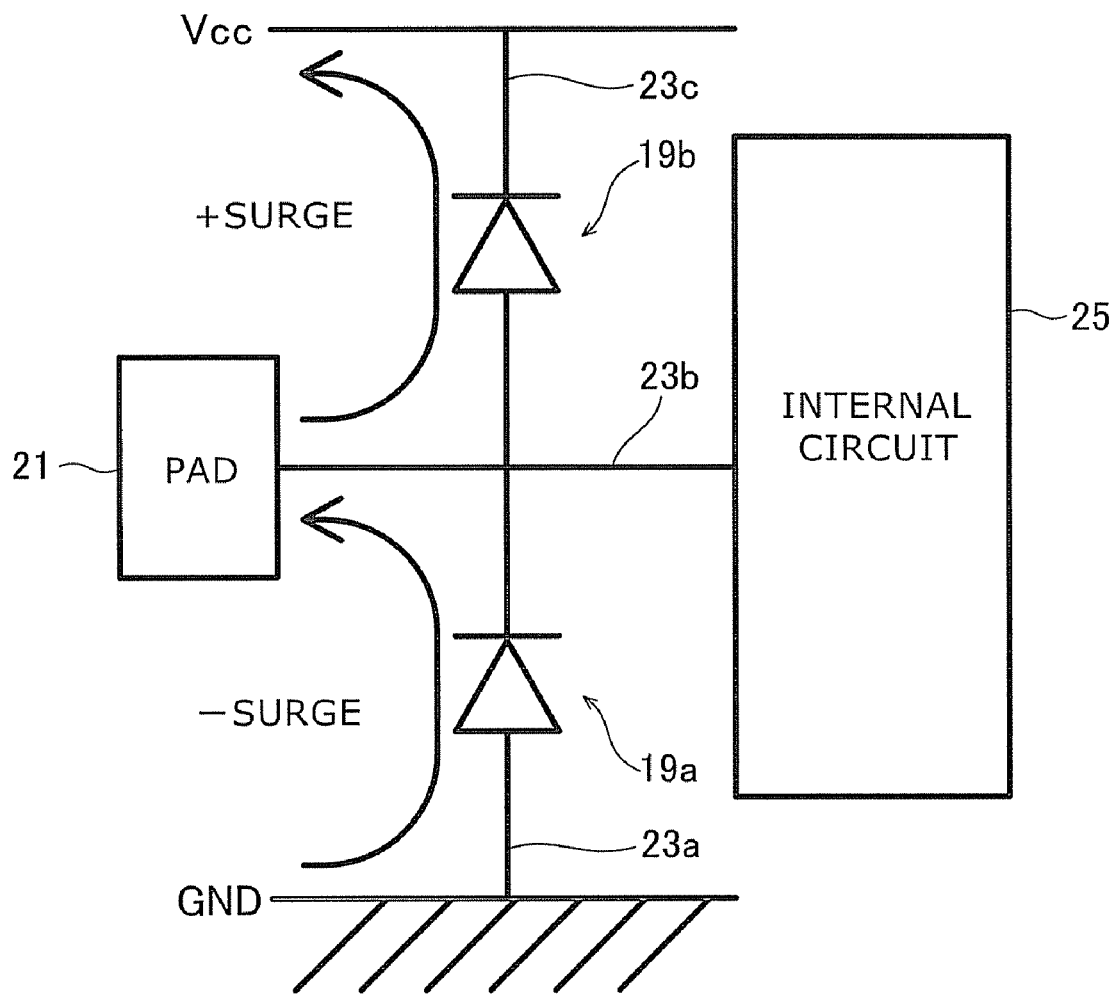
FIG. 6 is a circuit diagram illustrating this semiconductor apparatus.

FIG. 6 is a circuit diagram illustrating this semiconductor apparatus.

As shown in FIG. 5, the semiconductor apparatus 11 according to this example includes a substrate 12 illustratively made of P-type single crystal silicon. An internal circuit 25 (see FIG. 6) is formed in a device region of the surface of the substrate 12, and a plurality of devices 13 are provided in the internal circuit 25. The device 13 is a functional device serving a function essential to the semiconductor apparatus 11, and is illustratively an NMOSFET (N-type metal oxide semiconductor field effect transistor) formed in the surface of the substrate 12. It is noted that, while FIG. 5 shows only one device 13 as a component of the internal circuit 25, the internal circuit 25 is actually composed of many active and passive devices of various types.

The device 13 includes a pair of $N^+$-regions formed in the surface portion of the substrate 12 and constituting source/drain regions 13a. The region between the $N^+$-regions 13a constitutes a channel region 13b. A gate insulating film 13c is formed on the source/drain regions 13a and the channel region 13b, and a gate electrode 13d illustratively made of polycrystalline silicon is provided on the gate insulating film 13c. A device isolation film 14 is formed between the devices 13 in the surface of the substrate 12, and a P-type inversion prevention layer 15 is formed directly below the device isolation film 14 in the substrate 12. The source/drain regions 13a and the inversion prevention layer 15 are formed by local ion implantation.

An interlayer insulating film 16 is provided on the substrate 12 and covers the device 13 and the device isolation film 14. A metal interconnection (not shown) is provided on the interlayer insulating film 16. An interlayer insulating film 17 is provided on the interlayer insulating film 16 and covers the metal interconnect.

A protective region is defined in a region (directly overlying zone neighborhood) including at least part of the directly overlying zone of the device region on the interlayer insulating film 17. Polycrystalline silicon layers 18a and 18b (hereinafter also collectively referred to as "polycrystalline silicon layer 18") made of polycrystalline silicon (polysilicon) are provided in the protective region on the interlayer insulating film 17. The polycrystalline silicon layer 18 is illustratively formed by depositing silicon by polycrystalline growth using low-pressure CVD (LPCVD), planarizing its upper surface by CMP, and patterning it by selective etching using photolithography.

Part of the polycrystalline silicon layer 18a is doped with P-type impurities and constitutes a P-type portion 18p. The rest of each polycrystalline silicon layer 18 is doped with N-type impurities and constitutes an N-type portion 18n. Both the P-type portion 18p and the N-type portion 18n are formed across the thickness of the polycrystalline silicon layer 18, and exposed to both the upper surface and the lower surface of the polycrystalline silicon layer 18. The P-type portion 18p and the N-type portion 18n are in contact with each other, forming a PN junction interface. Thus, in the polycrystalline silicon layer 18a, a diode 19a composed of the P-type portion 18p and the N-type portion 18n is formed. Likewise, a diode 19b is formed in the polycrystalline silicon layer 18b. The diodes 19a and 19b (hereinafter also collectively referred to as "diode 19") are protective devices that protect the device 13 from electrostatic discharge.

An interlayer insulating film 20 is formed on the entire surface of the interlayer insulating film 17 so as to cover the polycrystalline silicon layers 18a and 18b. A pad region is defined in a region (directly overlying zone neighborhood) including at least part of the directly overlying zone of both the device region and the protective region on the interlayer insulating film 20. A pad 21 (see FIG. 6) is formed in the pad region on the interlayer insulating film 20.

A top passivation film 22 is formed on the entire surface of the interlayer insulating film 20. In the top passivation film 22, the directly overlying zone of the pad 21 is opened, where the pad 21 is exposed. A gold wire, for example, is bonded to the pad 21, or a bump such as a gold bump or a copper bump is formed on the pad 21, and thereby the pad 21 is connected to the outside. Metal interconnects 23a, 23b, 23c are formed on the top passivation film 22. Vias 23a to 24d are provided through the interlayer insulating film 20 and the top passivation film 22. A via 24e is provided through the gate insulating film 13c, the interlayer insulating films 16 to 20, and the top passivation film 22.

The P-type portion 18p of the polycrystalline silicon layer 18a (diode 19a) is connected to the metal interconnect 23a through the via 23a. Ground potential (GND) is applied to the metal interconnect 23a. The N-type portion 18n of the polycrystalline silicon layer 18a is connected to the metal interconnect 23b through the via 24b. The P-type portion 18p of the polycrystalline silicon layer 18b (diode 19b) is connected to the metal interconnect 23b through the via 24c. The N-type portion 18n of the polycrystalline silicon layer 18b is connected to the metal interconnect 23c through the via 24d. A power supply potential (Vcc) is applied to the metal interconnect 23c. The metal interconnect 23b is connected to one of the source/drain regions 13a of the device 13 through the via 24e. Thus the metal interconnect 23 is connected to the internal circuit 25 (see FIG. 6). The metal interconnect 23 is connected also to the pad 21 (see FIG. 6). It is noted that, in every polycrystalline silicon layer 18, its extraction portion, that is, the junction between the polycrystalline silicon layer 18 and the via 24, is provided with a highly-doped layer (not shown) that has the same conductivity type as that of the portion enclosing the extraction portion and that has a concentration high enough to form ohmic contact.

Thus, as shown in FIG. 6, in the semiconductor apparatus 11, a cathode of the diode 19a with its anode connected to the ground potential interconnect (metal interconnect 23a) and an anode of the diode 19b with its cathode connected to the power supply potential interconnect (metal interconnect 23c) are connected to the interconnect (metal interconnect 23b) connecting the pad 21 to the internal circuit 25. Consequently, the diodes 19a and 19b serve as an electrostatic voltage withstanding protective device for the internal circuit 25.

Next, the operation and effect of this example are described.

As shown in FIGS. 5 and 6, in the semiconductor apparatus 11, the internal circuit 25 including the device 13 is formed in a device region of the surface of the substrate 12, and a protective region is defined in the directly overlying zone neighborhood of the device region on the interlayer insulating film 17. A polycrystalline silicon layer 18 is formed in the protective region, and a diode 19 serving as a protective device is formed in the polycrystalline silicon layer 18. Hence the semiconductor apparatus 11 does not need a dedicated space for placing the protective device and can be downsized.

Furthermore, a pad region is defined in the directly overlying zone neighborhood of the device region and the protective region on the interlayer insulating film 22, and a pad 21 is formed in the pad region. Hence the semiconductor apparatus 11 does not need a dedicated space for placing the pad and can be further downsized.

Furthermore, in general, when a gold wire, for example, is bonded to the pad 21 or a bump such as a gold bump or a copper bump is formed on the pad 21, mechanical stress is unavoidably applied to the pad 21. If this stress is transferred to the internal circuit 25, the internal circuit 25 may incur damage (bonding damage). However, in this example, the polycrystalline silicon layer 18 and the interlayer insulating film 20 are placed between the pad 21 and the internal circuit 25. Hence the stress applied to the pad 21 can be prevented from being transferred to the internal circuit 25. Thus damage to the internal circuit 25 can be prevented.

Next, a second example of the invention is described.

The semiconductor apparatus according to this example is different in the configuration of the diode 19 from the semiconductor apparatus 11 (see FIG. 5) according to the first example described above. More specifically, in the diode 19, the polycrystalline silicon layer 18 is generally entirely occupied by a P-type portion 18p, and an N-type portion 18n is formed in the P-type portion 18p. The N-type portion 18n is exposed to the upper surface of the polycrystalline silicon layer 18, and not exposed to its lower surface. Furthermore, as in the first example described above, in every polycrystalline silicon layer 18, its extraction portion is provided with a highly-doped layer (not shown) that has the same conductivity type as that of the portion enclosing the extraction portion and that has a concentration high enough to form ohmic contact. According to this example, as compared with the first example described above, the area of the PN junction interface in the diode can be increased. The configuration, operation, and effect in this example other than the foregoing are the same as those in the first example described above.

Next, a third example of the invention is described.

In the semiconductor apparatus according to this example, contrary to the second example described above, the polycrystalline silicon layer 18 is generally entirely occupied by an N-type portion 18n, and a P-type portion 18p is formed in the N-type portion 18n. The P-type portion 18p is exposed to the upper surface of the polycrystalline silicon layer 18, and not exposed to its lower surface. The extraction portion of the polycrystalline silicon layer 18 is provided with a highly-doped layer. Thus the polycrystalline silicon layer 18 constitutes a diode serving as a protective device. The configuration, operation, and effect in this example other than the foregoing are the same as those in the second example described above.

Next, a fourth example of the invention is described.

Figure 7:
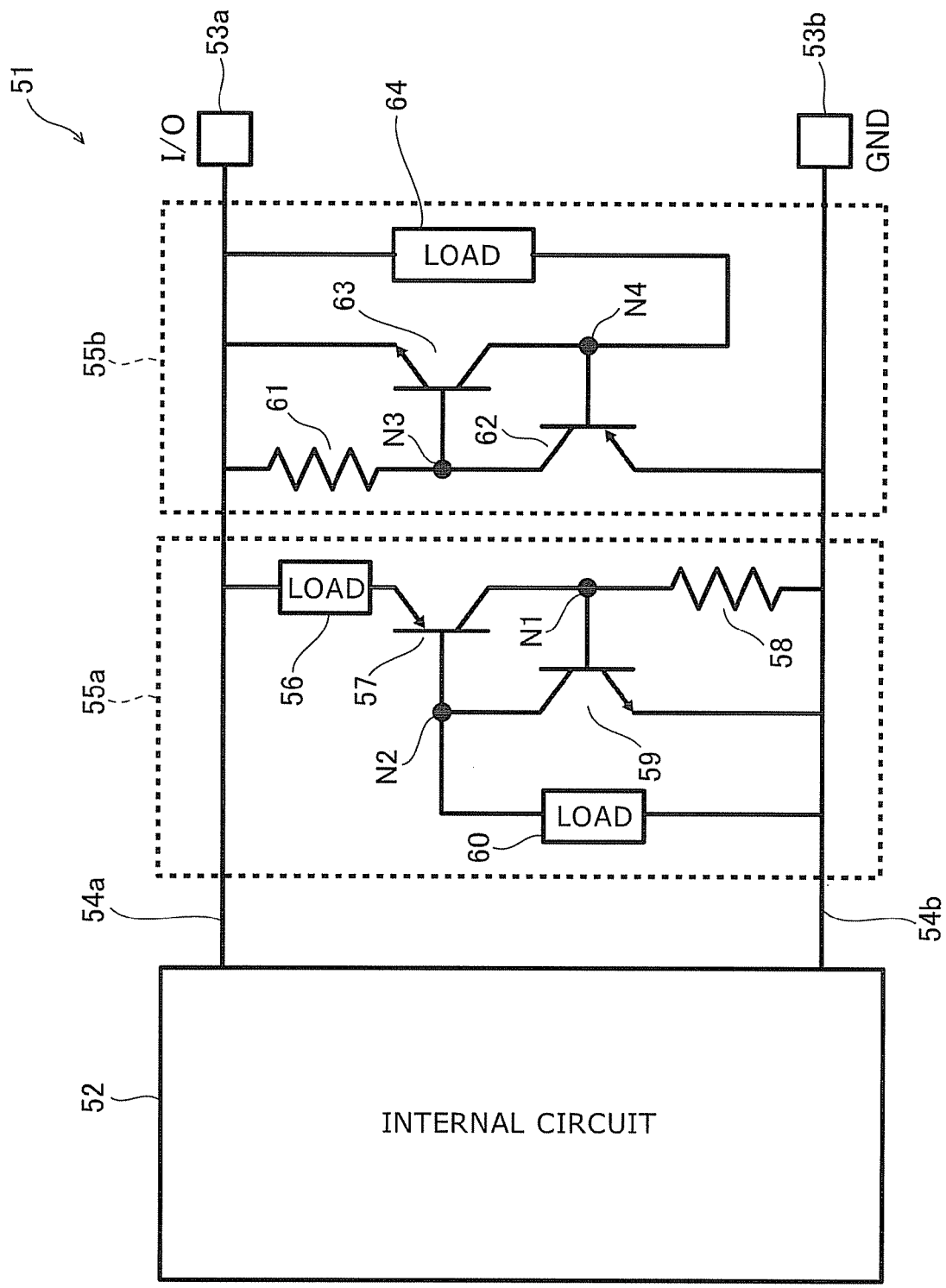
FIG. 7 is a circuit diagram illustrating a semiconductor apparatus according to a fourth example of the invention.

FIG. 7 is a circuit diagram illustrating a semiconductor apparatus according to this example.

Figure 8:
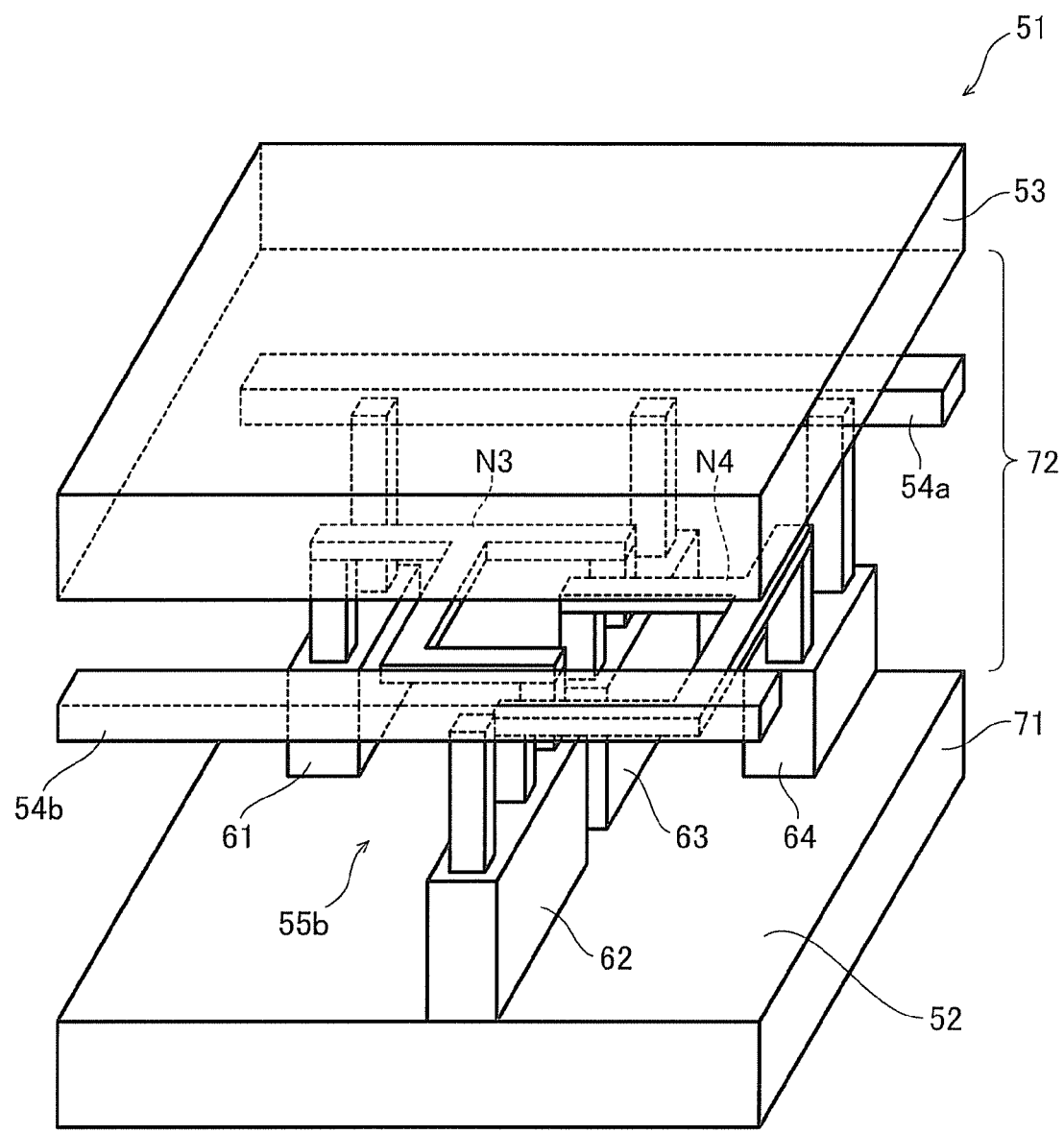
FIG. 8 is a perspective view schematically illustrating the semiconductor apparatus shown in FIG. 7.

FIG. 8 is a perspective view schematically illustrating this semiconductor apparatus.

Figure 9A:
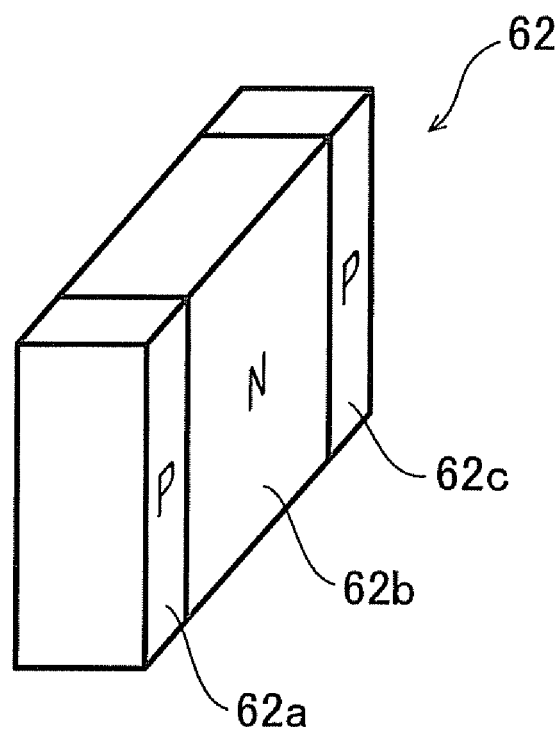
FIG. 9A is a perspective view illustrating the PNP-type transistor shown in FIG. 8.
Figure 9B:
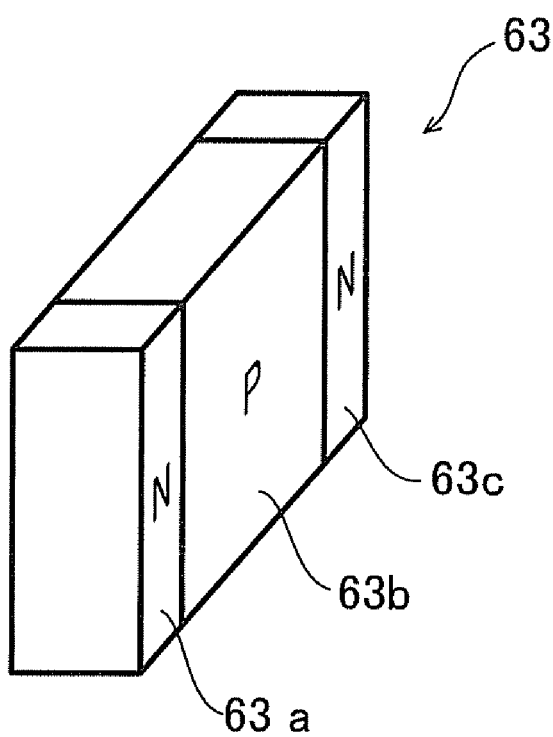
FIG. 9B is a perspective view illustrating the NPN-type transistor shown in FIG. 8.

FIG. 9A is a perspective view illustrating the PNP-type transistor shown in FIG. 8, and FIG. 9B is a perspective view illustrating the NPN-type transistor shown in FIG. 8.

As shown in FIG. 7, the semiconductor apparatus 51 according to this example includes an internal circuit 52, to which an I/O (input/output) pad 53a and a GND pad 53b are connected. The I/O pad 53a is a pad for externally inputting/outputting a signal to/from the internal circuit 52. The GND pad 53b is a pad for supplying ground potential to the internal circuit 52.

Protective circuits 55a and 55b are connected in parallel to an interconnect 54a connecting the internal circuit 52 to the I/O pad 53a and an interconnect 54b connecting the internal circuit 52 to the GND pad 53b. The protective circuit 55a is a thyristor-type protective circuit against +surge, and the protective circuit 55b is a thyristor-type protective circuit against −surge.

The protective circuit 55a (+surge circuit) includes a load 56, a PNP-type transistor 57, and a resistor 58 connected serially in this order between the interconnect 54a and the interconnect 54b. Furthermore, the protective circuit 55a includes an NPN-type transistor 59 and a load 60. The NPN-type transistor 59 has a collector connected to the base of the PNP-type transistor 57, an emitter connected to the interconnect 54b, and a base connected to the node N1 between the collector of the PNP-type transistor 57 and the resistor 58. The load 60 is connected between the interconnect 54b and the node N2 between the base of the PNP-type transistor 57 and the collector of the NPN-type transistor 59.

The protective circuit 55b (−surge circuit) includes a resistor 61 and a PNP-type transistor 62 connected serially in this order between the interconnect 54a and the interconnect 54b. Furthermore, the protective circuit 55b includes an NPN-type transistor 63 and a load 64. The NPN-type transistor 63 has a collector connected to the base of the PNP-type transistor 62, an emitter connected to the interconnect 54a, and a base connected to the node N3 between the resistor 61 and the PNP-type transistor 62. The load 64 is connected between the interconnect 54a and the node N4 between the base of the PNP-type transistor 62 and the collector of the NPN-type transistor 63. The above loads 56, 60, and 64 are illustratively diodes.

As shown in FIG. 8, the semiconductor apparatus 51 includes a substrate 71 illustratively made of P-type single crystal silicon, and a multilevel interconnect layer 72 is provided on the substrate 71. The internal circuit 52 is formed in the surface of the substrate 71, and the protective circuits 55a and 55b are formed in the directly overlying zone of the internal circuit 52 in the multilevel interconnect layer 72. Pads 53 such as the I/O pad 53a and the GND pad 53b are formed in the directly overlying zone of the internal circuit 52 on the multilevel interconnect layer 72, the directly overlying zone being also the directly overlying zone of the protective circuit 55a or 55b. It is noted that the protective circuit 55a (+surge circuit) and the interlayer insulating film are not shown in FIG. 8.

The multilevel interconnect layer 72 includes a plurality of patterned polycrystalline silicon layers, which form the resistors 58 and 61, the PNP-type transistors 57 and 62, the NPN-type transistors 59 and 63, and the loads 56, 60, and 64 made of diodes. Furthermore, the multilevel interconnect layer 72 also includes the interconnects 54a and 54b, and interconnects and vias interconnecting the devices in the protective circuit 55a and in the protective circuit 55b.

For example, as shown in FIG. 9A, in the PNP-type transistor 62, both end portions of a polycrystalline silicon layer patterned into a rectangular parallelepiped are doped with P-type impurities to constitute P-type portions 62a and 62c, and its center portion is doped with N-type impurities to constitute an N-type portion 62b. That is, the N-type portion 62b is sandwiched between the P-type portions 62a and 62c. On the other hand, as shown in FIG. 9B, in the NPN-type transistor 63, both end portions of a polycrystalline silicon layer patterned into a rectangular parallelepiped are doped with N-type impurities to constitute N-type portions 63a and 63c, and its center portion is doped with P-type impurities to constitute a P-type portion 63b. That is, the P-type portion 63b is sandwiched between the N-type portions 63a and 63c.

In the PNP-type transistor 62, the P-type portion 62a is connected to the interconnect 54b through a via, the N-type portion 62b is connected to the load 64 and the N-type portion 63a of the NPN-type transistor 63 through a via and an interconnect, and the P-type portion 62c is connected to the resistor 61 and the P-type portion 63b of the NPN-type transistor 63 through a via and an interconnect. The N-type portion 63c of the NPN-type transistor 63 is connected to the interconnect 54a. The extraction portion of each transistor is provided with a highly-doped layer. More specifically, a highly-doped P-type layer (not shown) doped with P-type impurities highly enough to form ohmic contact is formed in the portion of the upper surface of each of the P-type portions 62a and 62c of the PNP-type transistor 62 connected to the via, and a highly-doped N-type layer (not shown) doped with N-type impurities highly enough to form ohmic contact is formed in the portion of the upper surface of the N-type portion 62b connected to the via. Likewise, a highly-doped N-type layer (not shown) is formed in the portion of the N-type portions 63a and 63c of the NPN-type transistor 63 connected to the via, and a highly-doped P-type layer (not shown) is formed in the portion of the P-type portion 63b connected to the via.

Also in this example, protective circuits 55a and 55b are provided in the directly overlying zone of the internal circuit 52, and a pad 53 is provided in the directly overlying zone thereof. Hence the same effect as in the first example described above can be achieved.

Next, a fifth example of the invention is described.

The semiconductor apparatus according to this example is different in the configuration of the transistors constituting the protective circuit from the fourth example described above. More specifically, in the semiconductor apparatus according to this example, in the PNP-type transistor 62, the P-type portion 62a includes the N-type portion 62b, and the N-type portion 62b includes the P-type portion 62c. The N-type portion 62b and the P-type portion 62c are exposed to the upper surface of the polycrystalline silicon layer constituting the PNP-type transistor 62, and not exposed to its lower surface.

Likewise, in the NPN-type transistor 63, the N-type portion 63a includes the P-type portion 63b, and the P-type portion 63b includes the N-type portion 63c. The P-type portion 63b and the N-type portion 63c are exposed to the upper surface of the polycrystalline silicon layer constituting the NPN-type transistor 63, and not exposed to its lower surface. As in the fourth example described above, the extraction portion of the PNP-type transistor 62 and the NPN-type transistor 63 is provided with a highly-doped layer. The configuration, operation, and effect in this example other than the foregoing are the same as those in the fourth example described above.

The invention has been described with reference to the embodiment and examples. However, the invention is not limited to the embodiment and examples. For instance, any of the above embodiment and examples with suitable additions, deletions, and modifications of components made by those skilled in the art is also encompassed within the scope of the invention as long as it includes the features of the invention.

The invention claimed is:

1. A semiconductor apparatus comprising:
   a substrate of semiconductor material;
   a first device formed in a first region of a surface of the substrate;
   an interlayer insulating film formed on the substrate;
   a semiconductor layer formed in a second region on the interlayer insulating film; and
   a second device formed in the semiconductor layer,
   the second region including at least part of a directly overlying zone of the first region.

2. The semiconductor apparatus according to claim 1, further comprising other interlayer insulating film formed on the interlayer insulating film, the other interlayer insulating film covering the semiconductor layer, and a pad formed in a third region on the other interlayer insulating film,
   the third region including at least part of a region which is the directly overlying zone of the first region and a directly overlying zone of the second region.

3. The semiconductor apparatus according to claim 1, wherein the first device is a functional device constituting a semiconductor circuit.

4. The semiconductor apparatus according to claim 1, wherein the second device is an electrostatic voltage withstanding protective device for protecting the first device.

* * * * *